(12) United States Patent
Matsumoto

(10) Patent No.: US 6,358,361 B1
(45) Date of Patent: *Mar. 19, 2002

(54) PLASMA PROCESSOR

(75) Inventor: Naoki Matsumoto, Osaka (JP)

(73) Assignee: Sumitomo Metal Industries Limited, Osaka (JP)

(*) Notice: Subject to any disclaimer, the term of this patent is extended or adjusted under 35 U.S.C. 154(b) by 0 days.

This patent is subject to a terminal disclaimer.

(21) Appl. No.: 09/486,114

(22) PCT Filed: Jun. 21, 1999

(86) PCT No.: PCT/JP99/03313

§ 371 Date: Feb. 18, 2000

§ 102(e) Date: Feb. 18, 2000

(87) PCT Pub. No.: WO99/66769

PCT Pub. Date: Dec. 23, 1999

(30) Foreign Application Priority Data

Jun. 19, 1998 (JP) .......................................... 10-189812

(51) Int. Cl.⁷ ................................................. H05H 1/00
(52) U.S. Cl. ............................... 156/345; 118/723 MW; 204/298.38
(58) Field of Search ................. 156/345; 118/723 MW; 204/298.38

(56) References Cited

U.S. PATENT DOCUMENTS

| | | |
|---|---|---|
| 5,134,965 A | 8/1992 | Tokuda et al. |
| 5,487,875 A | 1/1996 | Suzuki |
| 5,538,699 A | 7/1996 | Suzuki |
| 6,076,484 A * | 6/2000 | Matsumoto et al. ..... 118/723 MW |

FOREIGN PATENT DOCUMENTS

| | | |
|---|---|---|
| JP | 62-5600 | 1/1987 |
| JP | 62-99481 | 5/1987 |
| JP | 5-129095 | 5/1993 |
| JP | 5-43097 | 10/1993 |
| JP | 5-345982 | 12/1993 |
| JP | 6-112138 | 4/1994 |
| JP | 6-112141 | 4/1994 |
| JP | 7-335633 | 12/1995 |
| JP | 8-273894 | 10/1996 |
| JP | 9-7793 | 1/1997 |
| JP | 10-233295 | 9/1998 |
| JP | 10-242124 | 9/1998 |
| JP | 11-40397 | 2/1999 |
| JP | 11-97424 | 4/1999 |
| JP | 11-121196 | 4/1999 |
| JP | 11-204295 | 7/1999 |
| TW | 328617 | 3/1986 |

* cited by examiner

*Primary Examiner*—Thi Dang
(74) *Attorney, Agent, or Firm*—Barnes & Thornburg

(57) ABSTRACT

The reactor 1 has an upper end portion attached with a ring member 10 supporting an annular seal plate 4. The ring member 10 has an upper surface attached with a cylindrical block member 25 screwed to the ring member 10. The block member 25 has a portion opposing the annular seal plate 4, the portion being formed with an annular waveguide antenna portion 12. The annular waveguide antenna portion 12 has a bottom portion fitted by an annular plate member 16 formed with a plurality of slits 15, 15 . . . at a predetermined circumferential interval. A heating block 26 made of aluminum shaped into a cylindrical form is embedded detachably within the block member 25. The heating block 26 has a bottom surface detachably attached with an electrode 18 by screws. The electrode 18 is earthed. According to the plasma processing apparatus with such a constitution as above, even if the reactor 1 has a large diameter, an overall size of the apparatus can be made as small as possible, making possible to install within a small space. Further, directivity of ions entering into a work is improved, and life of the reactor 1 becomes long.

16 Claims, 13 Drawing Sheets

PLASMA PROCESSOR

TECHNICAL FIELD

The present invention relates to a plasma processing apparatus wherein a semiconductor substrate, a glass substrate for a liquid crystal display and so on is etched, ashed or otherwise processed by a plasma generated by using a microwave.

BACKGROUND ART

A plasma generated by adding energy from outside to a reacting gas is widely used in a manufacturing process of an LSI, an LCD and so on. Especially in a process of dry etching, use of the plasma is an indispensable core technology. Generally, exciting means for generating the plasma uses either a microwave having a frequency of 2.45 GHz for example, or an RF (radio frequency) having a frequency of 13.56 MHz for example. The former has an advantage over the latter in that a plasma of a higher density can be obtained. However, in a plasma processing apparatus using the microwave, it was difficult to generate the plasma in a wide area and at a uniform density. Yet, because of the above-mentioned advantage that a plasma of a higher density can be obtained in such a plasma apparatus, there has been a requirement for an apparatus capable of processing a large size of the semiconductor substrate, the glass substrate for LCD and other materials. In order to meet the requirement, the applicant of the present invention proposed in Japanese Patent Application Laid-Open No. 62-5600 (1987), Japanese Patent Application Laid-Open No. 62-99481 (1987), and so on, a following apparatus:

FIG. 1 is a sectional side view of a plasma apparatus of the same type as disclosed in Japanese Patent Application Laid-Open No. 62-5600 (1987) and Japanese Patent Application Laid-Open No. 62-99481 (1987). FIG. 2 is a plan view thereof. A reactor 41 in the shape of a rectangular box is entirely made of aluminum. The reactor 41 has an upper opening sealed airtight by a seal plate 44 for introducing a microwave. The seal plate 44 is made of a dielectric such as silica glass or alumina, i.e. which is heat resistant, transmittable by microwaves, as well as having a small rate in dielectric loss.

The reactor 41 has an upper portion connected with and covered by a cover member 50 in the shape of a rectangular box. The cover member 50 has a ceiling portion attached with a dielectric plate 51. There is an air gap 53 between the dielectric plate 51 and the seal plate 44. The dielectric plate 51 is made of such a dielectric like as a fluororesin such as Teflon (registered trademark), a polyethylene resin, a polystyrene resin and so on, being formed into a plate having a substantially pentagon in the shape of a rectangle portion combined with a triangle portion, with an apex of the pentagon provided with a projected portion. The projected portion is inserted into a waveguide 61 connected to a circumferential surface of the cover member 50. The waveguide 61 is connected to a microwave generator 60. A microwave emitted from the microwave generator 60 is guided by the waveguide 61 into the projected portion of the dielectric plate 51.

As has been described above, the projected portion of the dielectric plate 51 has a base end continuing to the substantially triangular tapered portion 51a as viewed from above. The microwave entered from the projected portion reaches the tapered portion 51a, expands widthwise of the tapered portion, and propagates throughout the whole of the dielectric plate 51. Then, the microwave reflects on an end surface of the cover member 50 opposing the waveguide 61. The incident wave is superimposed on the reflected wave, forming a standing wave in the dielectric plate 51.

The reactor 41 has an inner space as a processing chamber 42. The processing chamber 42 has a circumferential wall formed with a through hole fitted with a pipe 45, through which a necessary gas is introduced into the processing chamber 42. The processing chamber 42 has a bottom wall having a center portion provided with a table 43 for placing a work W to be processed by the plasma. The table 43 is connected to a high frequency power source 47 via a matching box 46. Further, the bottom wall of the reactor 41 is formed with exhaust holes 48 so that an atmosphere inside the processing chamber 42 is exhausted from the exhaust holes 48.

By using the plasma apparatus of the above constitution, a surface of the work W can be etched according to the following steps: First, inner gas is exhausted from the exhaust holes 48, bringing the processing chamber 42 into a partial vacuum of a desired pressure. Then, the reactive gas is supplied through the pipe 45 into the processing chamber 42. Then, the microwave generator 60 is activated to generate a microwave, and the microwave is introduced through the waveguide 61 into the dielectric plate 51. When introduced, the microwave is allowed by the tapered portion 51a to expand uniformly within the dielectric plate 51, forming a standing wave within the dielectric plate 51. The standing wave forms a leakage electric field below the dielectric plate 51, which introduces through the air gap 53 and seal plate 44 into the processing chamber 42. In such a manner, the microwave propagates inside the processing chamber 42, generating the plasma within the processing chamber 42.

The table 43 is applied with a high frequency wave by the high frequency power source 47 via the matching box 46, so that a bias electric potential is generated. The bias electric potential draws ions within the plasma onto the work W at an accelerated speed to etch the surface of the work W. According to the above, if a diameter of the reactor 41 is increased for a capacity to process the work W having a large size, it is possible to uniformly introduce the microwave to all regions of the reactor 41. Therefore, a uniform anisotropic etching can be performed even to the large sized work W.

There is a problem however: As has been described above, according to the prior art plasma processing apparatus, in order to uniformly expand the microwave throughout the dielectric plate 51, there is provided the seal plate 44, as well as the tapered portion 51a formed as part of the dielectric plate 51 projecting horizontally from an edge portion of the reactor 41. Size of the tapered portion 51a is determined in accordance with the area of the dielectric plate 51, i.e. the diameter of the processing chamber 42. As a result, when the prior art plasma processing apparatus is to be installed, there is a problem that an extra horizontal space must be provided for housing the tapered portion 51a which projects out of a perimeter of the reactor 41.

On the other hand, there has been a trend to increase the size of the work W, and there is a requirement for the reactor 41 having an increased diameter. Further, at the same time, there is a requirement that such an apparatus should not demand for extra space for installation; in other words, the apparatus must be installed within as small space as possible. However, according to the prior art apparatus as described above, the size of the tapered portion 51a depends on the diameter of the reactor 41, and therefore if the diameter of the reactor 41 is increased, the size of the tapered portion 51a must be made accordingly longer. As a result, the requirements conflicted against each other, i.e. a demand for a plasma processing apparatus having an increased diameter of the reactor 41 yet capable of being installed within as small space as possible.

Further, according to the prior art plasma processing apparatus, the circumferential wall of the reactor 41 for example is earthed so as to serve as a earthed electrode for the table 43 which is applied with the high frequency wave. However, with such an arrangement, there is another problem in that the inner surface of the circumferential wall of the reactor 41 is hit and damaged by the ions from within the plasma, decreasing life of the reactor 41. Still further, when the circumferential wall of the reactor 41 is earthed, there is a possibility that there will not be enough bias electric potential generated on the surface of the table 43. In such a case, the ions will have poor directivity toward the work W, which could be lower processing characteristics such as anisotropy and so on.

The present invention is made under the above circumstances, and it is therefore an object of the present invention to provide a plasma processing apparatus capable of being built as compact as possible so as to be installed in a small space even if the diameter of the reactor is large, having an improved directivity of the ions toward the work, and capable of providing longer life of the reactor.

DISCLOSURE OF THE INVENTION

A plasma processing apparatus according to the present invention, in brief summary, has a following arrangement. Specifically, an electrode is provided facing a table on which a work is to be placed, and an annular sealing member for introduction of a microwave is provided outside the electrode. Further, an antenna for emitting the microwave into a container is provided facing the seal plate for introduction of the microwave.

A plasma processing apparatus according to a first invention comprises an antenna emitting a microwave; a container into which the microwave emitted from the antenna is to be introduced; a table being provided with the container, being connected to a power source for application of a high frequency wave, for placement of a work for plasma processing by the microwave introduced into the container; and an electrode being provided with the container, facing the table. The invention is characterized by that the container has a sealing member for introduction of the microwave, provided at a location surrounding an outer perimeter of the electrode; that the antenna is faced with the sealing member; and that the microwave emitted from the antenna is introduced into the container through the sealing member.

In such a plasma apparatus as according to the first invention, the antenna shaped in a ring or a Roman character C or otherwise and disposed to face the annular sealing member provided in the container (reactor) emits the microwave, which is introduced through the sealing member into the container, thereby generating a plasma. When the high frequency wave is applied to the table, with the electrode faced to the table serving as a earthed electrode, the plasma generated as described above is drawn to the work placed on the table.

It has become possible to enter the microwave into the antenna without expanding the microwave widthwise. Thus, the antenna does not have to extend out of the container. As a result, the plasma processing apparatus according to the present invention can have a horizontal dimension made as small as possible. In other words, the plasma processing apparatus according to the present invention uses the antenna for supplying the microwave, and therefore it becomes possible to uniformly supply the microwave by using a limited space. Further, the antenna is disposed to face the annular sealing member, making possible to uniformly introduce the microwave into the container.

On the other hand, the electrode faced to the table applied with the high frequency wave can be used as the earthed electrode. As a result, the ion within the plasma is prevented from hitting and damaging an inner circumferential wall of the container, increasing life of the container. Further, since it is possible to stably generate a bias electric potential in the table, the ions within the plasma are drawn onto the work substantially perpendicularly, making possible to improve processing characteristics such as anisotropy and so on.

A plasma processing apparatus according to a second invention is the plasma processing apparatus according to the first invention, characterized by that the electrode is made of a material of a silicon family.

In such a plasma processing apparatus as according to the second invention, when a gas of a fluorocarbon family ($C_xF_y$ gas) is used as the reactive gas for etching a silicon oxide film for example, the $C_xF_y$ gas is dissociated by the plasma to form fluorine molecules (F or $F_2$), relatively decreasing an etching rate of the silicon oxide film to the etching rate of a resist. However, since the electrode is made of the material of a silicon family according to the a present invention, fluorine molecules will contact and catalyze with the electrode to form and vaporize as $SiF_4$. Thus, the fluorine molecules are selectively removed. This improves an etching rate of the silicon oxide film to the etching rate of the resist, making possible to perform the etching at a high selectivity ratio. Further, the electrode made of a material of a silicon family has another advantage of reduced problem about contamination.

A plasma processing apparatus according to a third invention is the plasma processing apparatus according to the first or second inventions, characterized by that the electrode is connected to a path for introduction of a gas into the container, and formed with a hole for supply of the gas into the container.

In such a plasma processing apparatus as according to the third invention, the reactive gas is introduced into the container through the holes being formed in the electrode facing the table. The reactive gas diffuses radially in all regions of the circumferential wall of the container, as well as substantially uniformly. Thus, the work is processed substantially uniformly by the plasma. Further, the reactive gas supplied in the container stays for a longer time within the plasma, improving efficiency in use of the reactive gas.

A plasma processing apparatus according to a fourth invention is the plasma processing apparatus according to the third invention, characterized in that the path is provided with a space for diffusion of the introduced gas.

In such a plasma processing apparatus as according to the fourth invention, the reactive gas is introduced into the space provided with the path, where the reactive gas is diffused to become uniformity. Then, the uniformly reactive gas is released through the holes formed in the electrode into the container. This makes possible to uniformly introduce into the container the gas from a plurality of parts of the electrode. Thus, the work can be processed more uniformly by the plasma.

A plasma processing apparatus according to a fifth invention is the plasma processing apparatus according to any of first through fourth inventions, characterized by further comprising a device for controlling of a temperature of the electrode.

In order to improve the processing characteristics of the plasma processing, it is important to control the temperature of a part exposed to the plasma. From such a point of view, in the plasma processing apparatus according to the fifth invention, the processing characteristics can be improved by adjusting the temperature of the electrode by the device for controlling the temperature.

A plasma processing apparatus according to a sixth invention is the plasma processing apparatus according to any of the first through fifth inventions, characterized by further comprising a power source for applying a high frequency wave to the electrode.

In such a plasma processing apparatus as according to the sixth invention, the high frequency wave of approximately 13.56 MHz for example is applied to the electrode, so that a plasma is generated between the electrode and the table separately from the plasma generated by the microwave introduced from the antenna into the container. In such a way, even if a distance between the table and a region where the plasma is generated, i.e. a distance from the sealing member and the electrode to the table, is made short, the plasma diffuses adequately, becoming substantially uniform in the plane including the work. Thus, the plasma processing apparatus can have a smaller vertical dimension, whereas needed plasma processing can be performed quickly.

Further, it becomes possible to generate the abovementioned plasma separately from the plasma generated by the microwave introduced from the antenna to the container. Thus, it becomes possible to equalize plasma-processing speed in a center portion and in a perimeter portion of the work, by controlling the power of the high frequency wave applied to the electrode, without controlling the power of the microwave emitted from the antenna.

A plasma processing apparatus according to a seventh invention is the plasma processing apparatus according to any of the first through sixth inventions, characterized by that the antenna has a waveguide path for introducing the microwave, being formed in a annular shape, a C-shape or a spiral shape, and the waveguide path having a portion formed with a slit, facing the sealing member.

A plasma processing apparatus according to an eighth invention is the plasma processing apparatus according to the seventh invention, characterized in that the waveguide is embedded with a dielectric.

In such plasma apparatuses as according to the seventh and eighth inventions, the microwave introduced into the annular waveguide of the antenna propagates inside the waveguide as progressive waves travelling in opposite directions to each other, and then both progressive waves meet and superimpose each other to form a standing wave within the antenna. On the other hand, the microwave entered in the antenna having the waveguide path formed in the shape of C or spiral reflect on the end portion of the waveguide path to form a standing wave in the antenna. This standing wave makes flow in an inner wall of the antenna an electric current that becomes maximum at a predetermined interval. Since the wall on which the electric current flows is formed with the slit, an electric field is emitted from the slit to the sealing member. Specifically, the microwave is emitted from the antenna to the sealing member. The microwave transmits the sealing member to be introduced into the container, generating a plasma. Since the waveguide is formed in the shape of C or spiral, it is possible to supply the microwave uniformly to a needed region. Further, since the waveguide is made to emit the microwave from the slit, needed emission of the microwave becomes possible by varying the shape and the location of the slit.

Further, a wavelength of the microwave entered into the antenna is decreased by the dielectric by $\sqrt{}$ ($\epsilon r$) times of the wavelength (where, $\epsilon r$ is a relative dielectric constant of the dielectric). Therefore, if the diameter of the antenna is the same, the antenna stuffed with the dielectric has more locations at which the electric current running in the inner wall of the antenna becomes maximum, than the antenna not stuffed with the dielectric, making possible to provide a greater number of slits accordingly. Therefore, it becomes possible to introduce the microwave uniformly into the container. It is possible that the waveguide is provided with the slits facing the sealing member with the stuffed the dielectric. More specifically, it is possible that the antenna has a bottom surface entirely opened. In such a case, as has been described, the microwave propagating in the dielectric forms the standing wave, the leakage electric field of the microwave passes through the sealing member to be introduced into the container, as a result, it is possible to introduce the microwave uniformly into the container.

A plasma processing apparatus according to a ninth invention is a plasma processing apparatus comprising: an antenna for emitting a microwave; a container into which the microwave emitted from the antenna is to be introduced; a table being provided with the container for placing a work for plasma processing by the microwave introduced into the container, and an electrode being provided with the container, being connected to an electrical power source for application of a high frequency wave, facing the table. This plasma processing apparatus is characterized by that the container has a sealing member provided at a location surrounding an outer perimeter of the electrode; that the antenna is faced with the sealing member; and that the microwave emitted from the antenna is introduced into the container through the sealing member.

In such a plasma processing apparatus as according to the ninth invention, by applying to the electrode a high frequency wave of a range approximately 13.56 MHz for example, it becomes possible to generate a plasma between the electrode and the table separately from the plasma generated by the microwave introduced from the antenna into the container. Thus, it becomes possible to equalize plasma-processing speed in a center portion and in a perimeter portion of the work, by controlling the power of the high frequency wave applied to the electrode, without controlling the power of the microwave emitted from the antenna.

Needless to say, the ninth invention may be combined with the second through eighth inventions in the same manner as is the first invention. Note should be made, however, that according to the ninth invention, the power source for applying the high frequency wave is connected to the electrode instead of the table. For this reason, if the sixth invention is to be combined with the ninth invention, the power source for applying the high frequency wave and for being connected to the table instead of the electrode is further included.

BEST MODE FOR CARRYING OUT THE INVENTION

Hereinafter, embodiments of the present invention will be described in detail with reference to the accompanying drawings.

(Embodiment 1)

Figure 1:
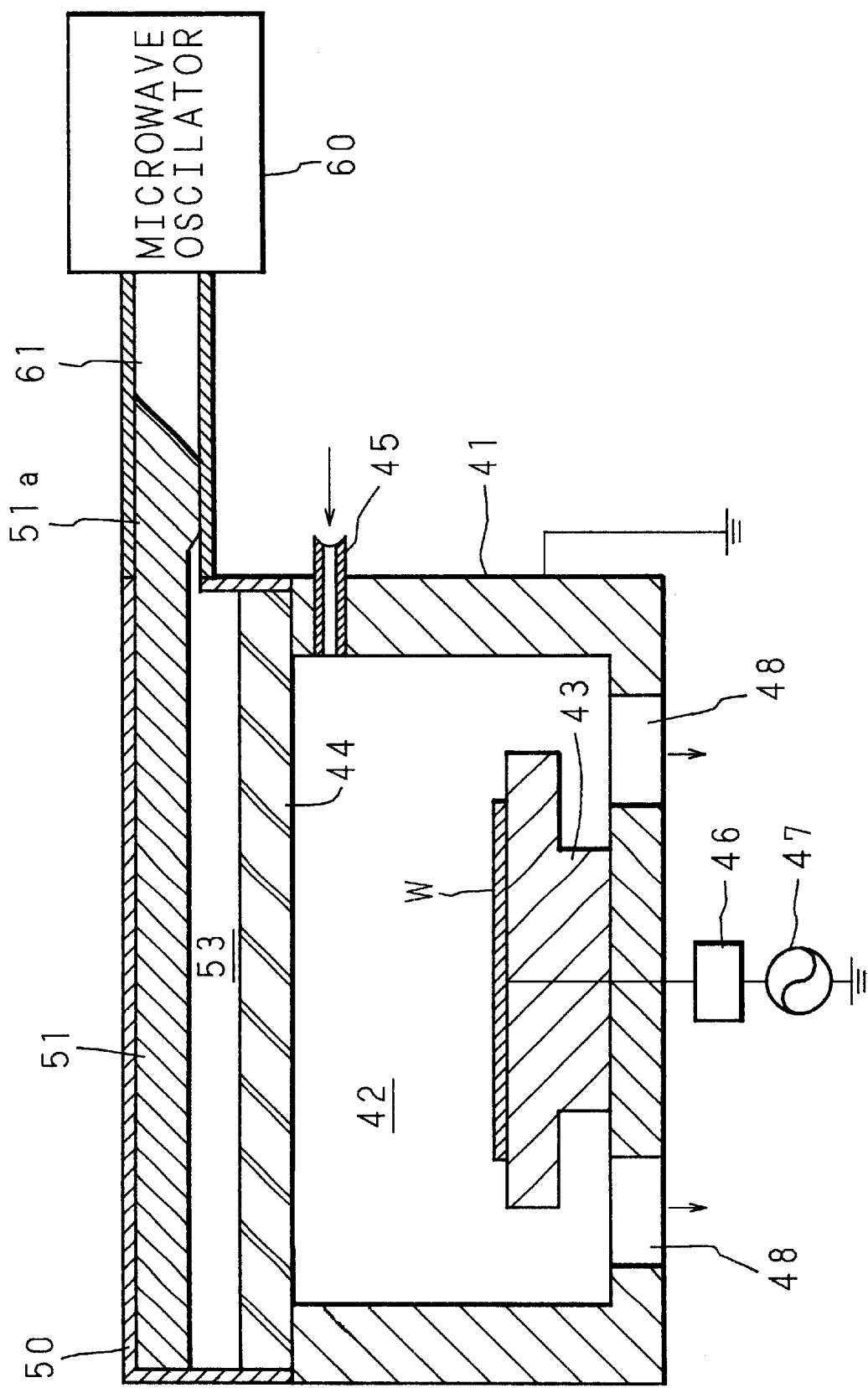
FIG. 1 is a sectional side view showing a plasma processing apparatus of the same type as a prior art apparatus.
Figure 2:
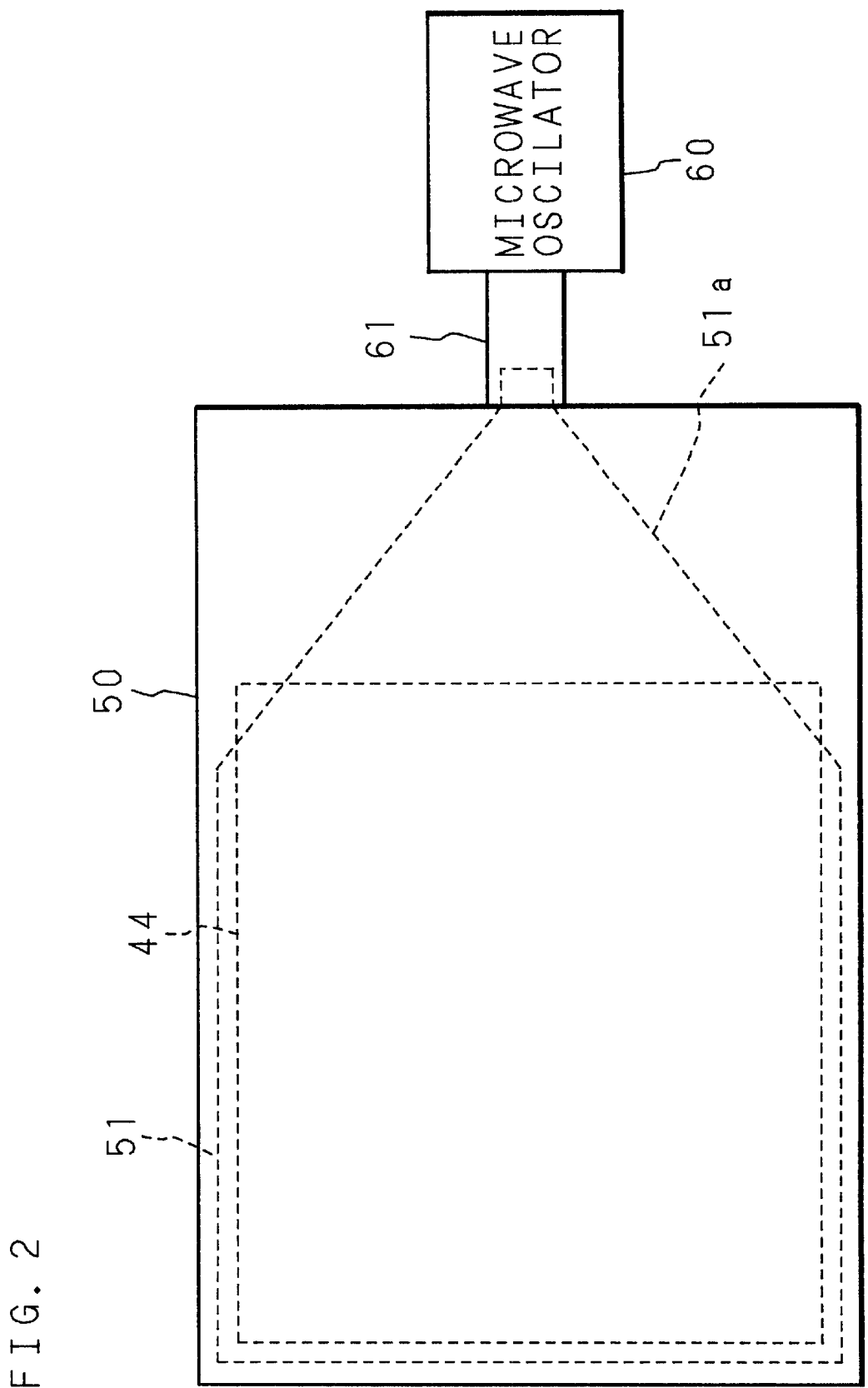
FIG. 2 is a plan view of the plasma processing apparatus shown in FIG. 1.
Figure 3:
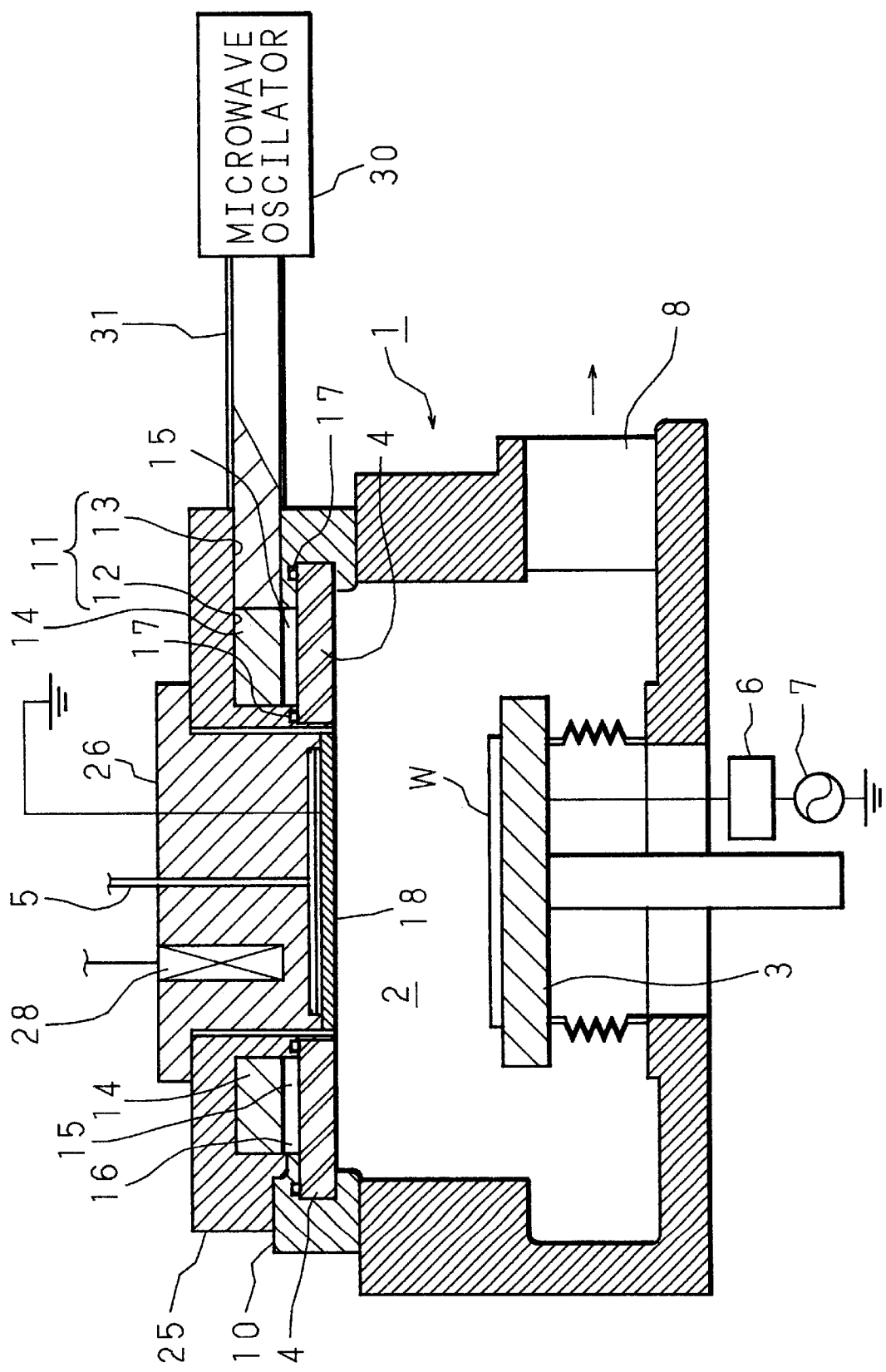
FIG. 3 is a sectional side view showing a structure of a plasma processing apparatus according to the present invention.
Figure 4:
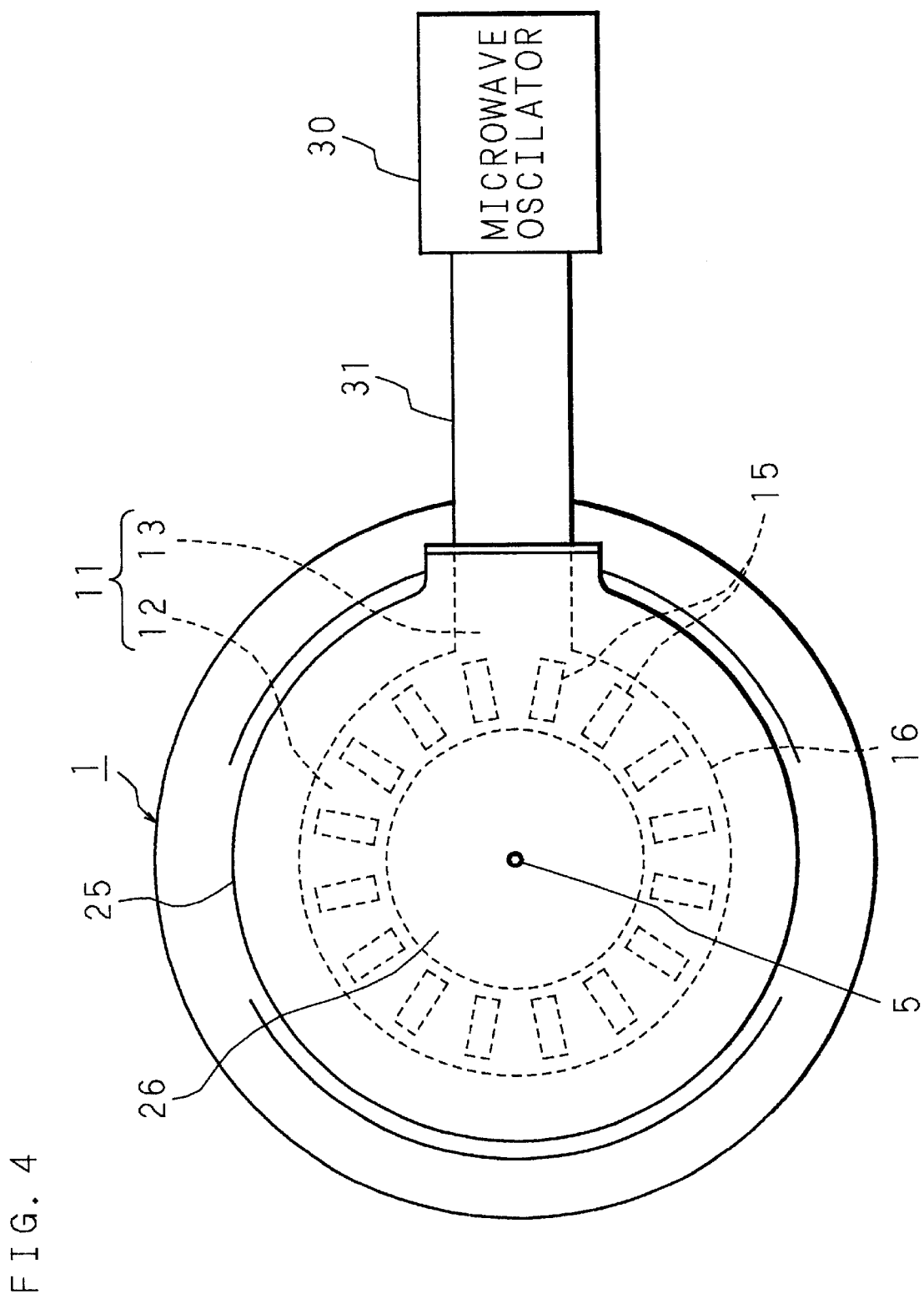
FIG. 4 is a plan view of the plasma processing apparatus shown in FIG. 3.

FIG. 3 is a sectional side view showing a structure of a plasma processing apparatus according to the present invention. FIG. 4 is a plan view of the plasma processing apparatus shown in FIG. 3. A reactor 1, which is cylindrical and has a bottom, is entirely made of a metal such as aluminum. The reactor 1 has an upper end portion attached with a ring member 10 having an inner circumferential surface formed with a groove. The groove of the ring member 10 is fitted by an outer circumferential edge portion of an annular seal plate 4 for introducing a microwave. Thereby the annular seal plate 4 is supported by the ring member 10. The annular seal plate 4 is made of a dielectric which is heat resistant, transmittable by microwaves, as well as having a small rate of dielectric loss, such as silica glass or alumina, formed into an annular plate-like form.

The ring member 10 has an upper surface attached with a cylindrical block member 25 having an outer diameter substantially identical with that of the ring member 10, and an inner diameter substantially identical with that of the annular seal plate 4, fixed by screws to the ring member 10. The block member 25 is made of a metal such as aluminum. The block member 25 has a portion opposing the annular seal plate 4, where there is formed an annular waveguide antenna portion 12 having a rectangular section and formed with a groove. Further, the block member 25 has a circumferential surface formed with a guide portion 13 including a rectangular hole communicating with the annular waveguide antenna portion 12. Further, the annular waveguide antenna portion 12 has a bottom portion fitted by an annular plate member 16 made of aluminum. The plate member 16 is formed with a plurality of slits 15, 15 ... at a predetermined circumferential interval. It should be noted here that inside the guide portion 13 and inside the annular waveguide antenna portion 12 are each fitted by a dielectric 14 made of a fluororesin such as Teflon (registered trademark), a polyethylene resin, a polystyrene resin or others (Use of Teflon is preferred, however).

A waveguide 31, from a microwave generator 30, is connected around the opening of the guide portion 13 which is on the circumferential surface of the block member 25. A microwave generated by the microwave generator 30 comes through the waveguide 31 into the guide portion 13 of the antenna 11. This incident wave is then introduced from the guide portion 13 to the annular waveguide antenna portion 12. The microwave introduced into the annular waveguide antenna portion 12 then propagates within the dielectric 14 inside the annular waveguide antenna portion 12 as progressive waves travelling in the annular waveguide antenna portion 12 in opposite directions to each other. Both progressive waves meet each other at a point within the annular waveguide antenna portion 12 diametrically opposite to the guide portion 13, forming a standing wave. This wall surface standing wave makes run a wall surface electric current that becomes maximum at a predetermined interval, in an inner surface of the annular waveguide antenna portion 12.

Specifically, if the dielectric 14 fitted into the annular waveguide antenna portion 12 is made of Teflon (registered trademark) having a dielectric constant ∈r=2.1, and if the propagating microwave is to have a basic propagation mode of rectangular TE10, with the microwave frequency being 2.45 GHz, the annular waveguide antenna portion 12 is made to have a height of 27 mm, and a width of 66.2 mm. The microwave of this mode propagates within the dielectric 14 in the annular waveguide antenna portion 12 with almost no energy loss.

Further, if the annular seal plate 4 has an outer diameter of 380 mm, inner diameter of 180 mm, and a thickness of 20 mm, and the dielectric 14 fitted into the annular waveguide antenna portion 12 is made of Teflon (registered trademark), a distance from the center of the annular waveguide antenna portion 12 to the center of width of the annular waveguide antenna portion 12 is made 141 mm. With this arrangement, a circle passing the center points of a width of the annular waveguide antenna portion 12 has a circumference (about 886 mm) substantially equal to a product of an integer multiplied by a wavelength (about 110 mm) of the microwave propagating within the annular waveguide antenna portion 12. As a result, the microwave will resonate within the annular waveguide antenna portion 12, with the above-mentioned standing wave becoming high-voltage and low-current at antinodes, and low-voltage and high-current at nodes, improving Q value of the antenna 11.

Figure 5:
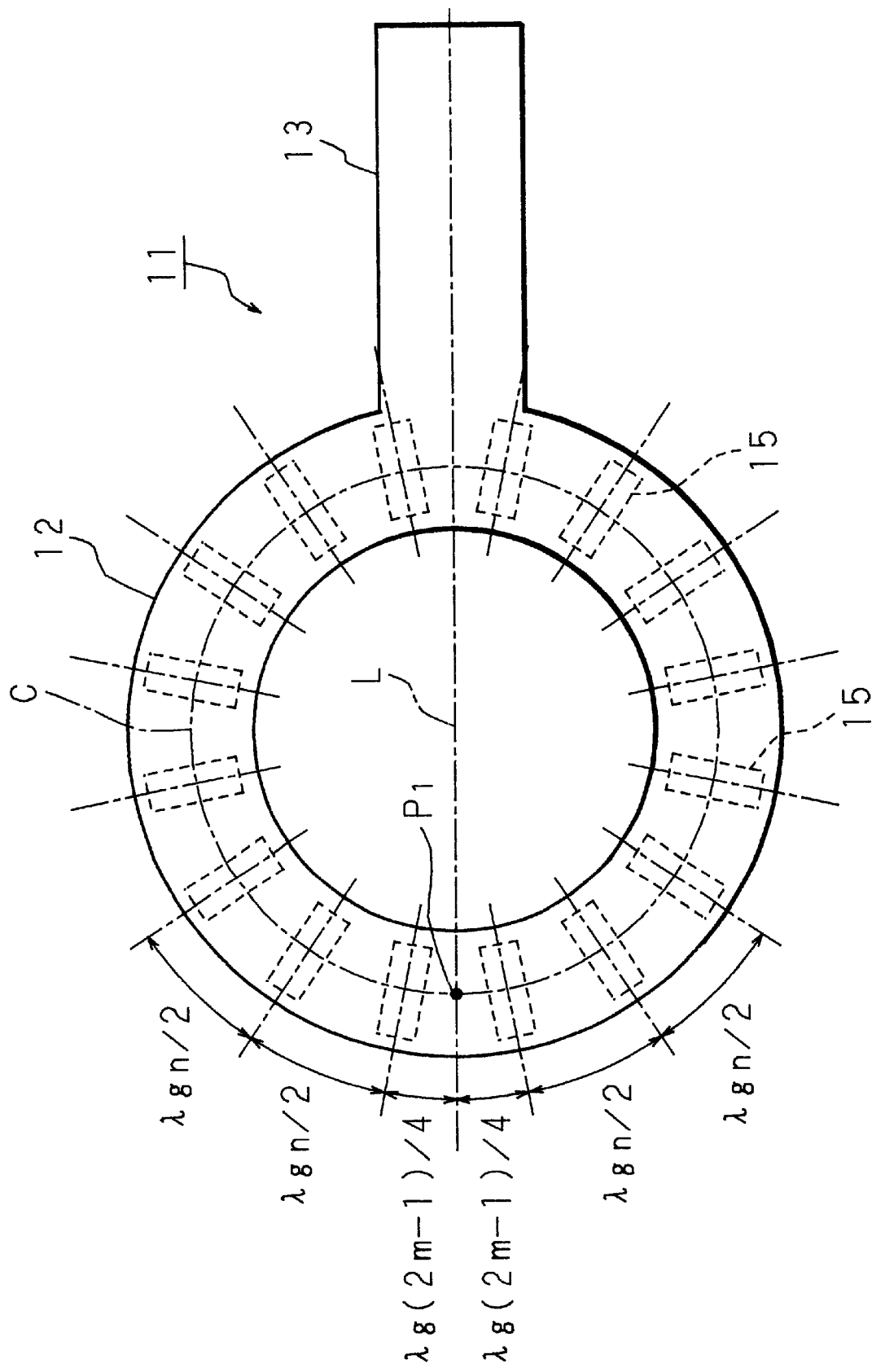
FIG. 5 is a view illustrating slits shown in FIGS. 3 and 4.

FIG. 5 is an illustration of the slits 15, 15 ... shown in FIGS. 3 and 4. As shown in FIG. 5, the slits 15, 15 ... are formed in the metal plate member 16 in a portion faced with the annular waveguide antenna portion 12, radially of the annular waveguide antenna portion 12, i.e. perpendicularly to the directions of microwave propagation within the annular waveguide antenna portion 12. When the annular waveguide antenna portion 12 has the dimensions described above, each of the slits 15, 15 is formed to have a length of 50 mm, width of 20 mm, with an interval between two adjacent slits of about 55 mm. More specifically, starting from an intersection point $P_1$ to be described later, two slits are formed at a distance of 27.5 mm respectively in the two directions. Then, the slit formation is made at every 55 mm interval.

In other words, each of the slits 15, 15 is laid in a following manner: First, the centerline of the guide portion 13 is extended as an extension line L, which intersects with the above-described circle C at two points. The intersection point farther away from the guide portion 13 among of the two points is made $P_1$, from which a distance $(2m-1) \cdot \lambda g/4$ (where m is an integer, $\lambda g$ is a wavelength of the microwave propagating within the annular waveguide antenna) is measured in the two directions along the circle C, where the first pair of the slits 15, 15 are formed respectively. Then, starting from each of the pair of slits 15, 15, the rest of the slits 15, 15 ... are formed at an interval of $n \cdot \lambda g/2$ (where n is an integer). With this arrangement, the slits 15, 15 ... are formed at respective locations where the nodes of the standing wave are formed. By such an arrangement, it becomes possible to efficiently emit the microwave from each of the slits 15, 15 . . . .

It should be noted here that according to the present embodiment, the slits 15, 15 . . . have respective lengths laid perpendicular to the direction of microwave propagation within the annular waveguide antenna portion 12. However, the present invention is not limited to this: the slits may be formed to cross obliquely to the direction of microwave propagation, or may be formed in the direction of microwave propagation. At certain times, a plasma generated within the reactor 1 alters the wavelength of the microwave propagating within the antenna 11, shifting the locations at which the electric current running in the circumferential wall of the annular waveguide antenna portion 12 becomes a maximum value. However, according to the slits formed to cross obliquely to or in the direction of the microwave propagation, it becomes possible to still include within the slits the shifted locations at which the electric current becomes maximum.

Each of the slits 15, 15 . . . is formed radially of the plate member 16 as has been described, and therefore the microwave is introduced uniformly into the entire region of the reactor 1. Further, as shown in FIG. 3, the antenna 11 is made in a circular form, and therefore can be provided with the block member 25 having the same diameter as the diameter of the reactor 1, without projecting out of the perimeter of the block member 25. Thus, even if the diameter of the reactor 1 is large, the size of the plasma processing apparatus can be relatively small, and therefore a plasma processing apparatus capable of being installed in a small space is realized.

The block member 25 described above is fitted detachably with a heating block 26 made of aluminum shaped into a cylindrical form having bottom surfaces each slightly higher than a bottom surface of the annular seal plate 4. The heating block 26 is embedded with a heater 28 as a device for heating an electrode 18.

The bottom surface of the heating block 26 has a cylindrical recess. The recess is closed by the electrode 18 made of a electrically conductive or semi-conductive material shaped into a circular plate, so as to provide a space 20 for diffusing gas. The electrode 18 is detachably screwed to the heating block 26. Further, the electrode 18 is electrically earthed. The screws for fixing the electrode 18 and the bottom surface of the above-mentioned annular seal plate 4 are protected by an annular plate made of quartz (not illustrated). Further, interconnecting portions of the reactor 1 and the ring member 10, annular seal plate 4, block member 25, and heating block 26 are sealed by heat-resistant 0 rings 17, 17 . . . (not all are illustrated) respectively to make airtight connections.

Figure 6:
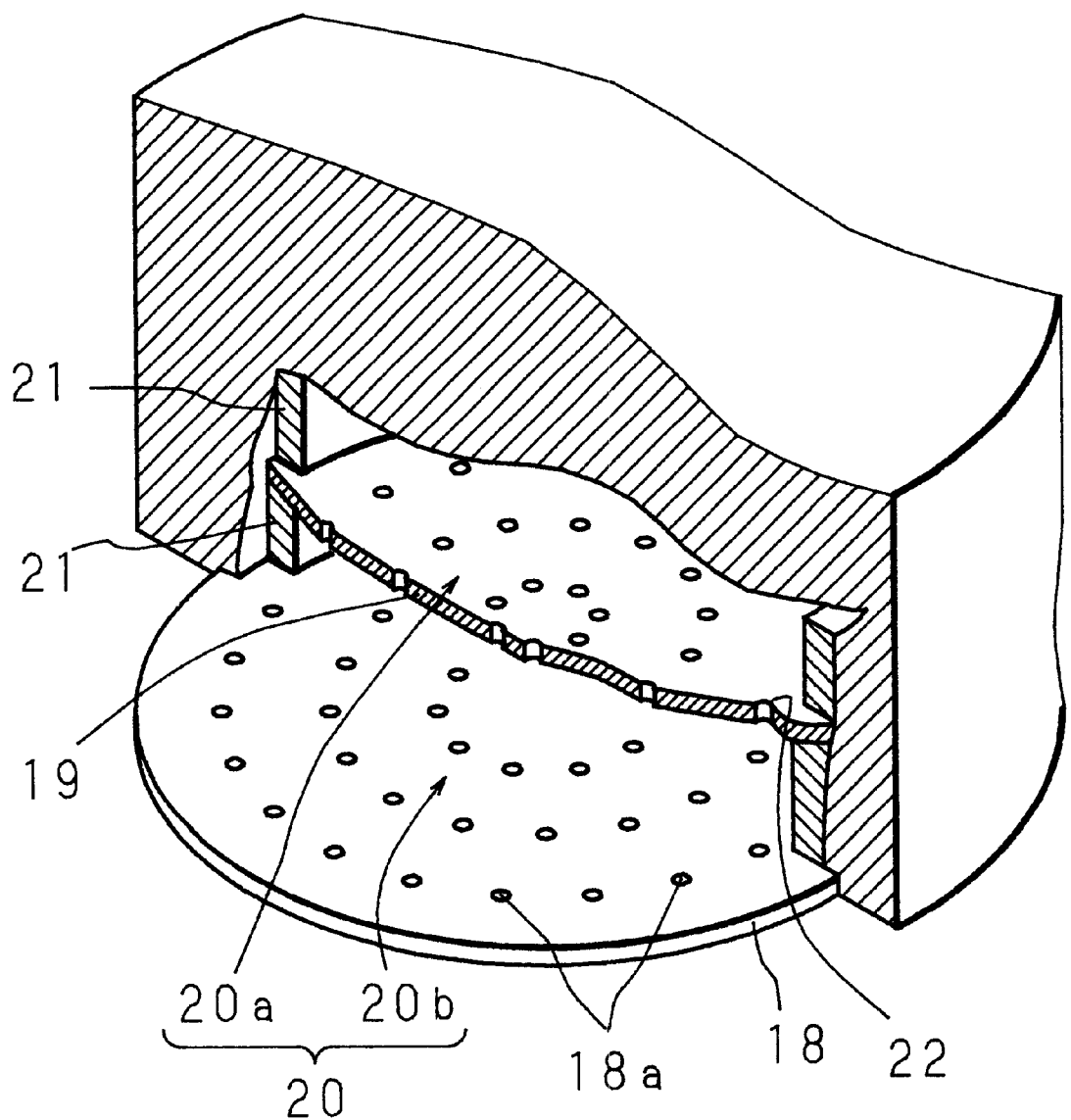
FIG. 6 is a typified partially exploded perspective view showing an electrode and space for gas diffusion shown in FIG. 3.

FIG. 6 is a typified partially exploded perspective view showing the electrode 18 and the space 20 shown in FIG. 3. As shown in FIG. 6, inside the space 20 is separated by a partition wall 19 into an upper chamber 20a and the lower chamber 20b. Between the partition wall 19 and a ceiling of the space 20, and between the partition wall 19 and the electrode 18, annular members 21, 21 are interposed, respectively. Further, the partition wall 19 and the electrode 18 are respectively formed with a plurality of through holes 22, 22 . . . and 18a, 18a . . . . The through holes 22 and 18a are formed at different locations laterally.

Further, as shown in FIG. 3, the space 20 is provided with a pipe 5 running through the heating block 26. A gas supplied through the pipe 5 into the space 20 diffuses within the upper chamber 20a, while being supplied through the holes 22, 22 . . . formed in partition wall 19 into the lower chamber 20b, being diffused uniformly, and then introduced through the holes 18a, 18a . . . formed in the electrode 18 into the processing chamber 2.

The processing chamber 2 has a bottom wall having a center portion provided with a vertically movable table 3 for placing a work W. The table 3 is connected to a high frequency power source 7 via a matching box 6. Further, a circumferential wall of the processing chamber 2 is formed with an exhaust hole 8 for discharging an atmosphere from inside the processing chamber 2. A high frequency wave applied to the table 3 is primarily for a purpose of controlling ions within the plasma, and has a frequency of 200 KHz through 2 MHz. However, depending on situations, an electric field of up to several tens of megahertz may be applied.

By using the plasma apparatus of the above arrangement, a surface of the work W can be etched according to the following steps: First, the heating block 26 and the electrode 18 are heated by the heater 28 to a predetermined temperature. Meanwhile an inner gas is discharged from the exhaust hole 8, bringing the processing chamber 2 to a partial vacuum of a desired pressure. Then, the reactive gas is supplied through the pipe 5 into the space 20, where the reactive gas is diffused uniformly. Then, the reactive gas is introduced from the electrode 18 into the processing chamber 2.

Next, the microwave generator 30 is activated to generate the microwave, and the microwave is introduced through the waveguide 31 into the antenna 11 to form the standing wave within the annular waveguide antenna portion 12. Due to this standing wave, an electric field emitted from the slits 15, 15 . . . of the antenna 11 is introduced through the annular seal plate 4 into the processing chamber 2, and the plasma is formed within the processing chamber 2. Further, simultaneously with the activation of the microwave generator 30, the high frequency wave is applied to the table 3 from the high frequency power source 7 via the matching box 6. An electric field formed between the table 3 and the electrode 18 draws ions from within the plasma onto the work W to etch the surface of the work W.

As described above, the ions within the plasma are drawn onto the work W by the electric field formed between the table 3 and the electrode 18 opposed to the table 3. Therefore, damage to the inner circumferential wall of the reactor 1 caused by the hit of ions from within the plasma is prevented, increasing the life of the reactor 1. Further, since the electrode 18 is detachably screwed to the heating block 26, replacement can be made easily when the electrode 18 is damaged. Further, since the electric field is formed perpendicularly to the surface of the work W, a stable bias electric potential is generated in the surface of the table 3. Therefore, the ions entering into the work W have a high directivity, improving process characteristics. Further, since the electrode 18 is heated to the needed temperature, the process characteristics are further improved.

Moreover, the reactive gas is introduced into the processing chamber 2 from the bottom portion of the electrode 18. For this reason, the reactive gas is supplied onto the work W placed in the processing chamber 2 as a substantially uniform flow of gas having a cross section of a diameter about the same with the diameter of the work W. Thus, the surface of the work W is processed substantially uniformly. Further, the reactive gas supplied in the processing chamber 2 stays for a longer time within the plasma, improving efficiency in use of the reactive gas.

(Embodiment 2)

According to the present embodiment the electrode 18 shown in FIG. 3 is made of a material of a silicon family such as Si, SiC, SiN or Si doped with P, B or another impurity. With such an arrangement, when a fluorocarbon gas ($C_xF_y$ gas) is used as the reactive gas for etching a silicon oxide film for example, fluorine molecules will contact and react with the electrode 18 to form and vaporize as $SiF_4$. Thus, the fluorine molecules can be selectively removed. This improves an etching rate of the silicon oxide film to the etching rate of the resist, making possible to perform the etching at a high selectivity ratio.

(Embodiment 3)

Figure 7:
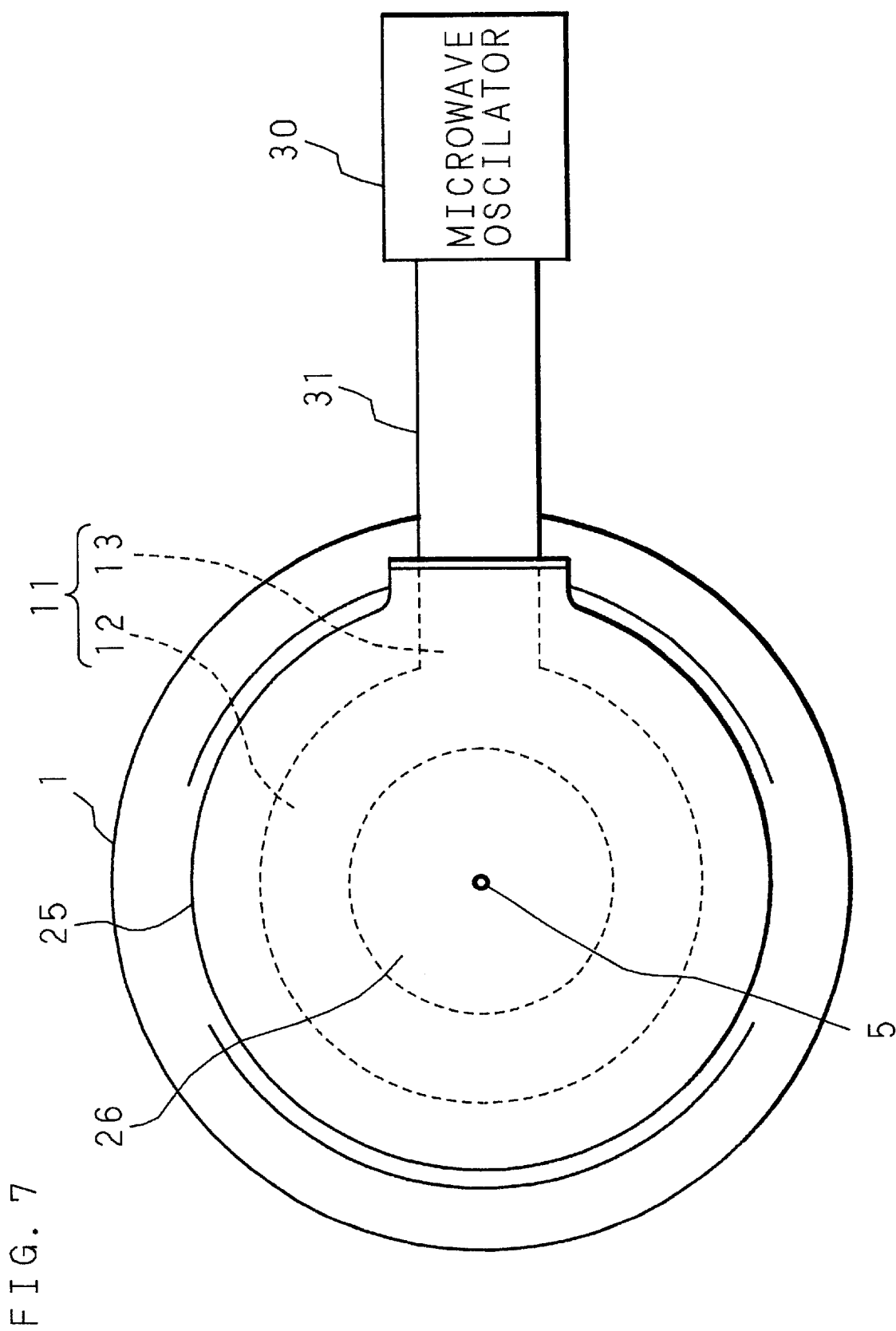
FIG. 7 is a plan view showing an embodiment 3.

FIG. 7 is a plan view showing the embodiment 3, illustrating the slits along the seal plate for introducing the microwave. It should be noted here that portions corresponding to those shown in FIG. 4 are indicated by the same alpha-numeral codes respectively, and will not be described again. Now, as shown in FIG. 7, the bottom portion of the annular waveguide antenna portion 12 is not provided with the plate member 16 shown in FIG. 3, but is left open. Further, the annular waveguide antenna portion 12 is stuffed with the dielectric 14 described earlier.

With the above arrangement, the microwave propagates within the dielectric 14 stuffed within the annular waveguide antenna portion 12 to form the standing wave, allowing its leakage electric field to be introduced through the seal plate 4 uniformly into all regions of the reactor 1. Further, with the above arrangement, even if the diameter of the reactor 1 is large, the plasma processing apparatus can have as small a size as possible, and therefore can be installed within a small space. Further, as has been described, the damage caused by the ions hitting the inner circumferential surface of the reactor 1 is prevented by the electrically earthed electrode, increasing the life of the reactor 1. Further, when the electrode is damaged, the replacement can be made easily. Still further, the directivity of the ions entering into the work W is improved, and therefore the process characteristics are improved.

(Embodiment 4)

Figure 8:
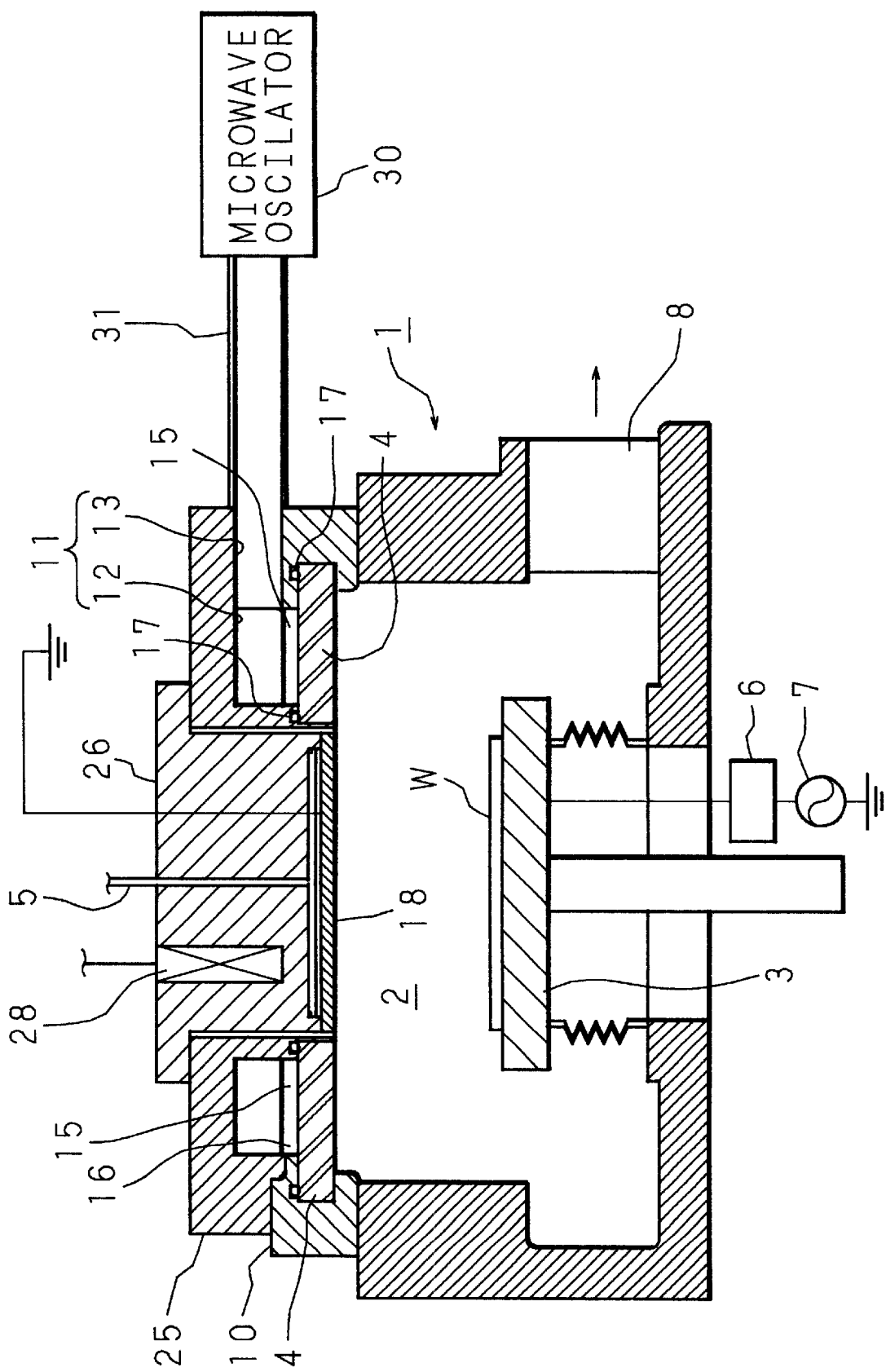
FIG. 8 is a sectional side view showing an embodiment 4.

FIG. 8 is a sectional side view showing an embodiment 4, illustrating a case in which the dielectric 14 shown in FIG. 3 is not provided. It should be noted here that portions corresponding to those shown in FIG. 3 are indicated by the same alpha-numeral codes respectively, and will not be described again. Now, as shown in FIG. 8, the bottom portion of the annular waveguide antenna portion 12 is fitted by the annular plate member 16 formed with a plurality of slits 15, 15 ..., whereas the antenna 11 is a hollow guide way without being stuffed with the dielectric 14 described earlier.

With the above arrangement, if the microwave propagating in the annular waveguide antenna portion 12 is to have a basic propagation mode of rectangular TE10, with the microwave frequency being 2.45 GHz, the annular waveguide antenna portion 12 is made to have a height of 27 mm, and a width of 96 mm. Further, the annular seal plate 4 is made to have an outer diameter of 440 mm, an inner diameter of 160 mm, and a thickness of 20 mm, and the distance from the center of the annular waveguide antenna portion 12 to a center of the width of the thereof is made 151 mm. With this arrangement, the circle passing the center points of width of the annular waveguide antenna portion 12 has a circumference substantially equal to a product of an integer multiplied by a wavelength (about 158 mm) of the microwave propagating within the annular waveguide antenna portion 12. Further, the plate member 16 provided in the annular waveguide antenna portion 12 is formed with the slits 15, 15 each having a length of 80 mm and a width of 20 mm at an interval of about 79 mm between two adjacent slits.

The microwave coming from the microwave generator 30 propagates via the waveguide 31 into the antenna 11, where the standing wave is formed. Due to this standing wave, an electric field emitted from the slits 15, 15 ... of the antenna 11 is introduced through the annular seal plate 4 into the processing chamber 2, and the plasma is formed within the processing chamber 2.

This makes possible, similarly to the description made earlier, for the microwave to be introduced through the annular waveguide antenna portion 12 uniformly into all regions of the reactor 1. Moreover, even when the diameter of the reactor 1 is large, the plasma processing apparatus can have as small a size as possible, and therefore can be installed within a small space. Further, the damage caused by the ions hitting the inner circumferential surface of the reactor 1 is prevented by the electrically earthed electrode 18, increasing the life of the reactor 1. Further, when the electrode 18 is damaged, the replacement can be made easily. Still further, the directivity of the ions entering into the work W is improved by the electrode 18, and therefore the process characteristics are improved.

(Embodiment 5)

Figure 9:
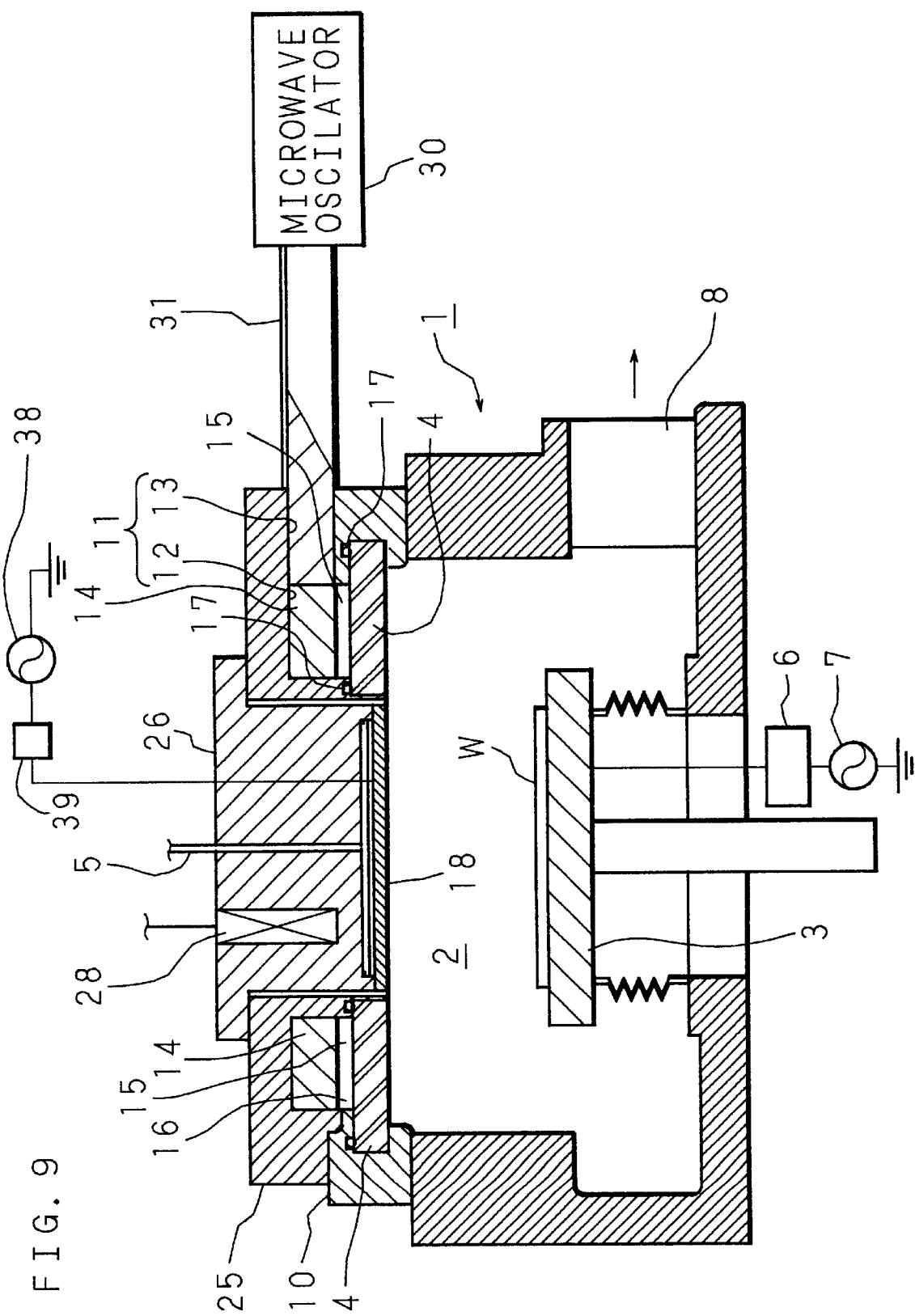
FIG. 9 is a sectional side view showing an embodiment 5.

FIG. 9 is a sectional side view showing an embodiment 5, illustrating an arrangement wherein the electrode 18 is applied with a high frequency wave. It should be noted here that portions corresponding to those shown in FIG. 3 are indicated by the same alpha-numeral codes respectively, and will not be described again. Now, as shown in FIG. 9, the electrode 18 is connected to a second high frequency power source 38 via a matching box 39. From this second high frequency power source 38 to the electrode 18, a high frequency wave of 13.56 MHz for example is applied.

According to the plasma processing apparatus with the above arrangements, while the microwave generator 30 generates the microwave, the high frequency wave of 13.56 MHz is applied from the second high frequency wave power source 38 to the electrode 18, so that a plasma is generated in a region faced with the electrode 18 within the processing chamber 2. In such a way, the plasma is generated also in a center portion surrounded by the antenna 11, i.e. beneath the electrode 18. Therefore, even when a distance between the table 3 and the annular seal plate 4 is short, it becomes possible to obtain a substantially uniform plasma in the plane including the surface of the table 3.

Further, it becomes possible to generate the plasma within the processing chamber 2 by applying the high frequency wave to the electrode 18, separately from the plasma generated by the microwave. Thus, it becomes possible to equalize plasma-processing speed in a center portion and in a perimeter portion of the work W, by controlling the power of the high frequency wave applied to the electrode 18, without controlling the power of the microwave generated by the microwave generator 30.

Further, etching anisotropy can be improved by applying from the high frequency power source 7 to the table 3, a high frequency electric field of $V_a \sin(\omega t)$ ($\omega$ is an angular frequency, and t is time), while applying from the second high frequency power source 38 to the electrode 18, a high frequency electric field of $\{-Vb \sin(\omega t)\}$, thereby giving to the ions within the plasma the electric potential of $(V_a+V_b)$.

During the above operation, the table 3 is applied with a high frequency electric field of 200 KHz through 2 MHz for example, for a purpose of controlling the ions within the plasma, whereas the electrode 18 is applied with a higher frequency electric wave of 13.56 MHz for example, than the frequency applied to the table 3, for a purpose of generating the plasma.

(Embodiment 6)

Figure 10:
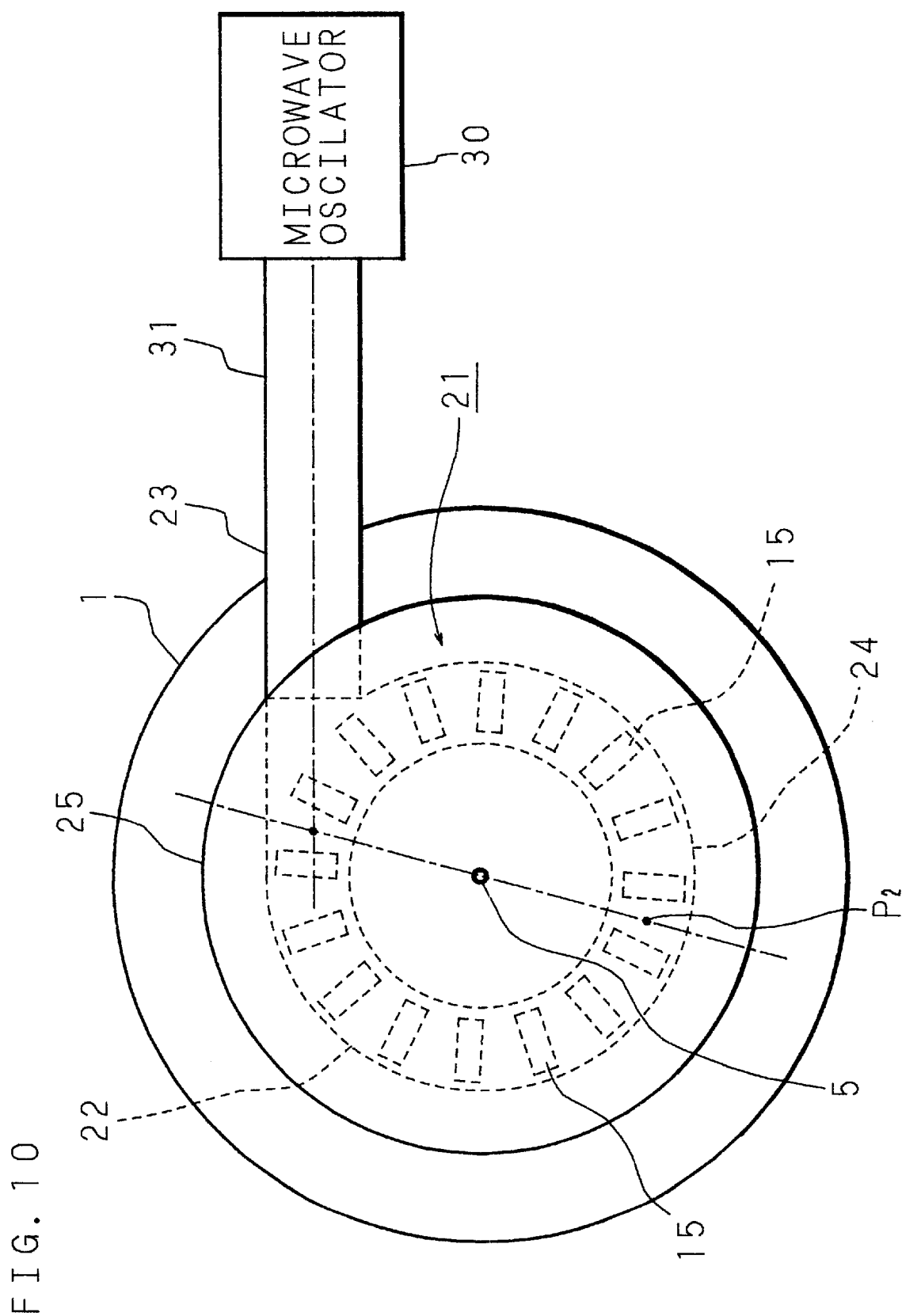
FIG. 10 is a typified plan view showing an embodiment 6.

FIG. 10 is a typified plan view showing an embodiment 6, illustrating a case wherein the connecting location of the guide portion of the annular waveguide antenna portion is altered. It should be noted here that portions corresponding to those shown in FIG. 4 are indicated by the same alpha-numeral codes respectively, and will not be described again. An antenna 21 according to the present embodiment is connected so that a guide portion 23 lies on a tangent to an annular waveguide antenna portion 22. The slits are formed in a plate member 24 in a following manner: First, the centerline of the guide portion 23 is extended so as to be tangent to the circle defined by the center points of the width of the annular waveguide antenna portion 22. A line is drawn from the tangential point through the center of the annular waveguide antenna portion 22 to find two intersections of the line with the above circle. Of the two intersections, the intersection which is not the above tangential point is selected as $P_2$, from which the distance $(2m-1) \cdot \lambda g/4$ (where m is an integer, $\lambda g$ is a wavelength of the microwave propagating within the annular waveguide antenna) is measured in the two directions along the circle, where the first pair of the slits 15, 15 . . . are formed respectively. Then, starting from each of the pair of slits 15, 15, the rest of the slits 15, 15 . . . are formed at an interval of $n \cdot \lambda g/2$.

(Embodiment 7)

Figure 11:
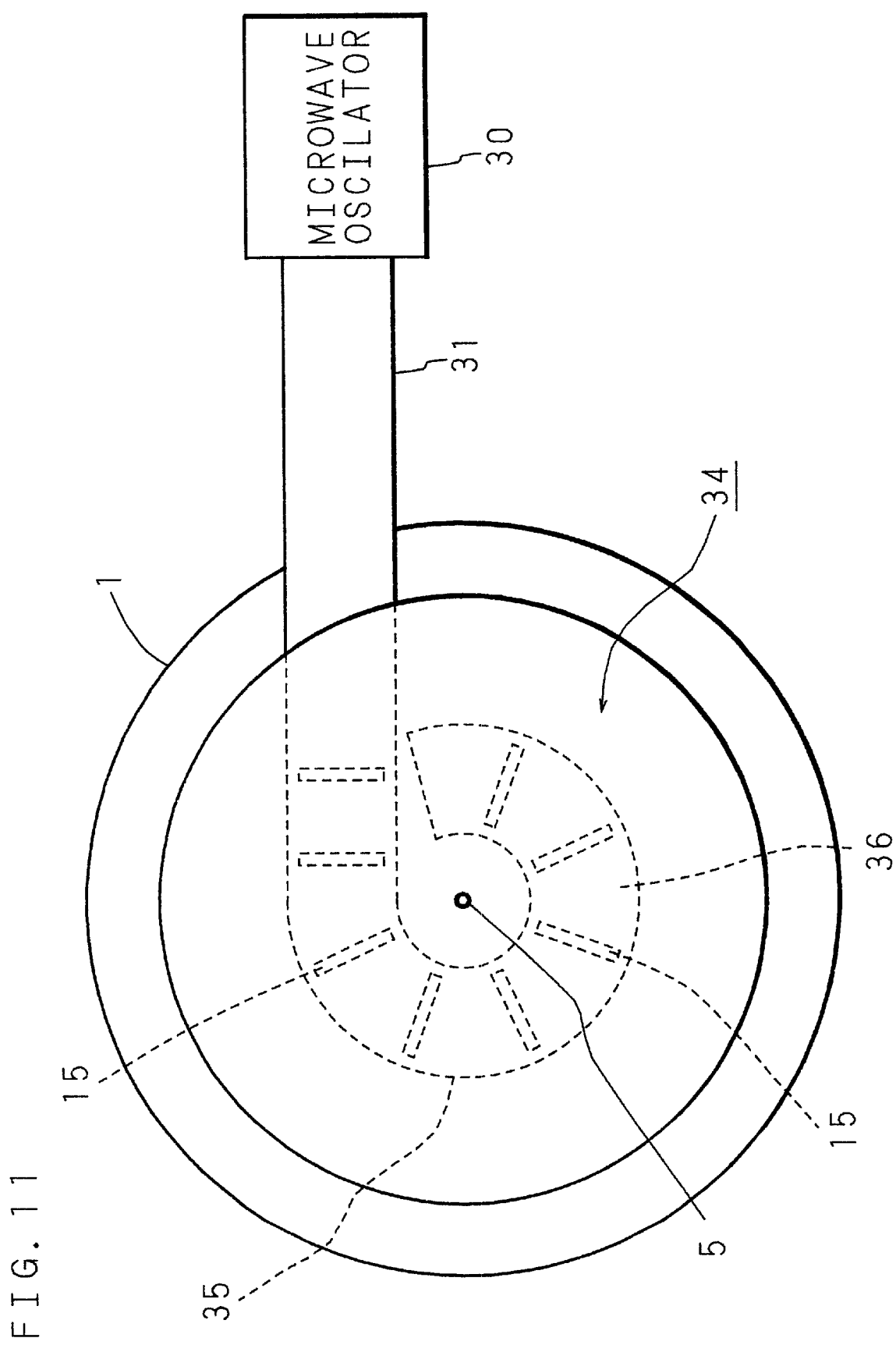
FIG. 11 is a typified plan view showing an embodiment 7.

FIG. 11 is a typified plan view showing an embodiment 7, illustrating a case wherein the shape of the antenna is altered. It should be noted here that in both figures, portions corresponding to those shown in FIG. 10 are indicated by the same alpha-numeral codes respectively, and will not be described again. An end of an antenna 34 is connected to the waveguide 31 communicating with the microwave generator 30, whereas the other end of the antenna 34 is closed. An end portion of the antenna 34 is formed straight, whereas the other end portion is formed into such a shape as C (an arc), a single spiral or another, as a curved portion 35 having a discretionary curvature. (FIG. 3 shows a C-shaped example.) The antenna 34 has a bottom portion fitted with a plate member 36. The plate member 36 has a portion corresponding to the curved portion 35, where a plurality of slits 15, 15 . . . are formed.

Figure 12:
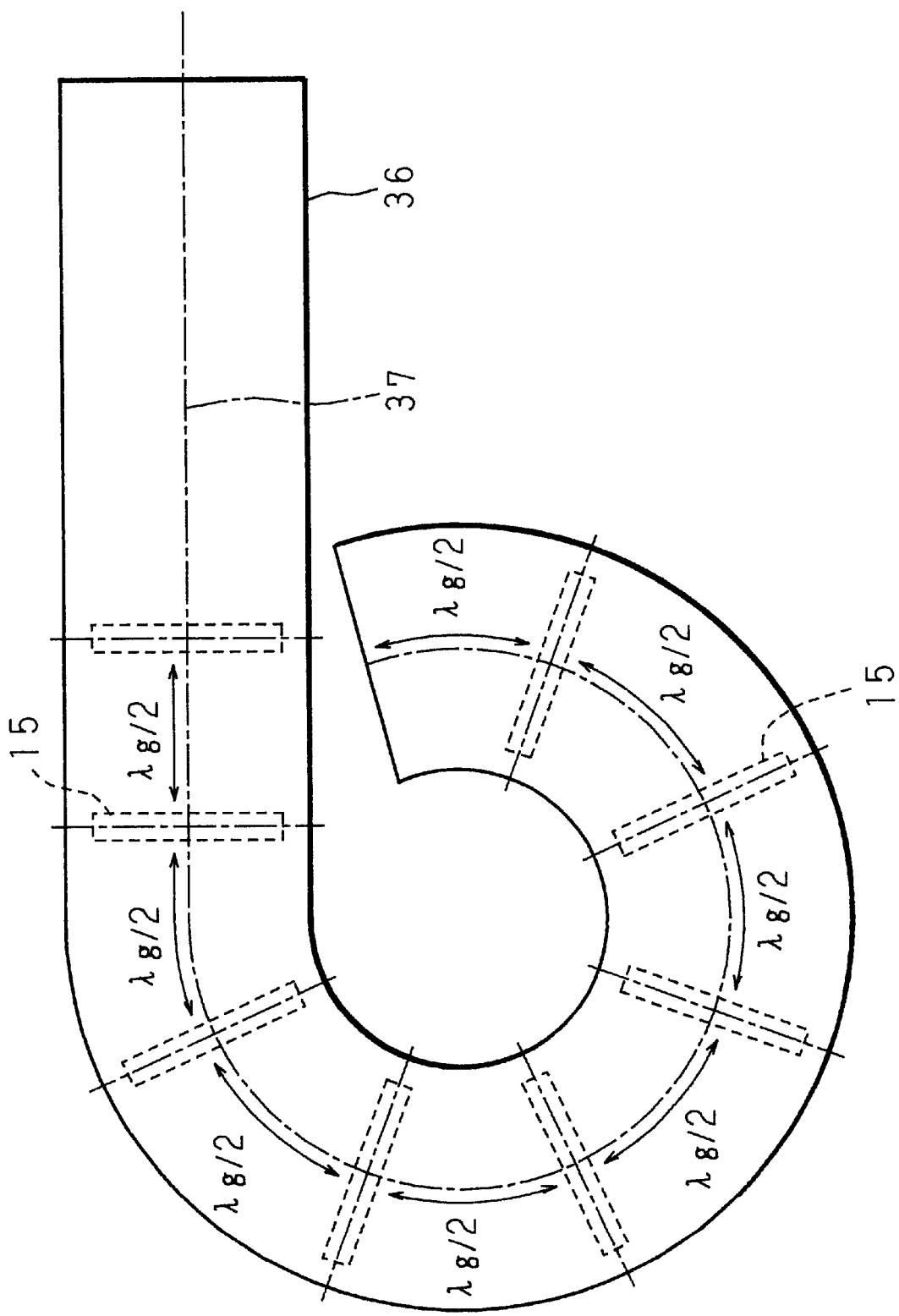
FIG. 12 is a view illustrating slits shown in FIG. 11.

FIG. 12 is a view illustrating specific arrangement of the slits 15, 15 . . . shown in FIG. 11. As shown in FIG. 12, the slits 15, 15 . . . are formed in a portion faced with the curved portion 35 of the plate member 36, perpendicularly to a center axis 37 of the curved portion 35. The slits 15, 15 . . . are formed at an interval of $n \cdot \lambda g/2$, starting from the closed end of the antenna. Specifically, each of the slits 15, 15 . . . is formed at a location at which the electrical current running through the bottom surface of the antenna becomes maximum value, so that a difference in electrical potential generated between each pair of adjacent slits 15, 15 . . . emits an electrical field from each of the slits 15, 15 . . . . This electric field is introduced through the annular seal plate 4 into the reactor 1. (See FIG. 3 for these two components).

(Embodiment 8)

Figure 13:
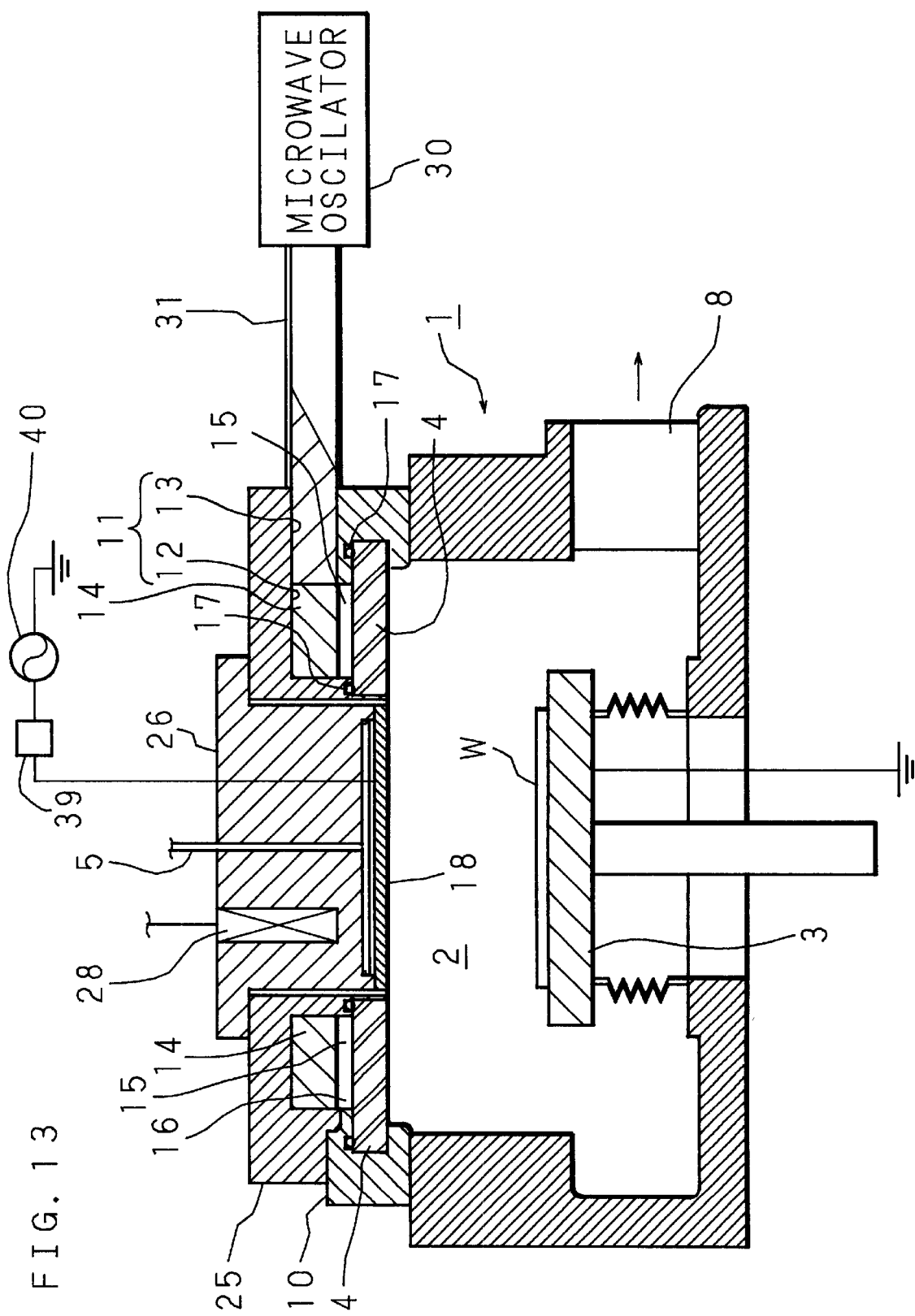
FIG. 13 is a sectional side view showing an embodiment 8.

FIG. 13 is a sectional side view showing an embodiment 8, wherein the electrode 18 is applied with a high frequency wave, whereas the table 3 is electrically earthed. It should be noted here that portions corresponding to those shown in FIG. 3 are indicated by the same alpha-numeral codes respectively, and will not be described again. Now, as shown in FIG. 13, the electrode 18 is connected to a high frequency power source 40 via a matching box 39. From this high frequency power source 40, a high frequency wave of about 13.56 MHz is applied to the electrode 18. The table 3 is electrically earthed.

According to the plasma processing apparatus with the above arrangements, similarly to the apparatus according to the embodiment 5, a plasma is generated in a central region surrounded by the antenna 11, i.e. a region beneath the electrode 18. Therefore, even if a distance between the table 3 and the annular seal plate 4 is short, it becomes possible to obtain a substantially uniform plasma in the plane including the surface of the table 3.

Further, it becomes possible to generate the plasma within the processing chamber 2 by applying the high frequency wave to the electrode 18, separately from the plasma generated by the microwave. Thus, it becomes possible to equalize plasma-processing speed in a center portion and in a perimeter portion of the work W, by controlling the power of the high frequency wave applied to the electrode 18, without controlling the power of the microwave generated by the microwave generator 30.

What is claimed is:

1. A plasma processing apparatus characterized by comprising:
   an antenna emitting a microwave,
   a container into which the microwave emitted from the antenna is to be introduced,
   a table being provided in the container, being connected to an electrical power source for application of a high frequency wave, for placing a work to be processed by plasma generated by the microwave introduced into the container, and
   an electrode being provided in the container, facing the table,
   wherein the container has a sealing member provided at a location surrounding a perimeter of the electrode,
   the antenna is faced with the sealing member, and
   the plasma processing apparatus is adapted that the microwave emitted from the antenna is introduced into the container through the sealing member.

2. The plasma processing apparatus according to claim 1, wherein the electrode is made of a material of a silicon family.

3. The plasma processing apparatus according to claim 1, wherein the electrode is connected to a path for introducing a gas into the container, being formed with a hole for supplying the gas into the container.

4. The plasma processing apparatus according to claim 3, wherein the path is provided with a space for diffusing the introduced gas.

5. The plasma processing apparatus according to any of claim 1, further comprising a device for controlling a temperature of the electrode.

6. The plasma processing apparatus according to any of claim 1, further comprising a power source for applying a high frequency wave to the electrode.

7. The plasma processing apparatus according to any of claim 1, wherein the antenna has a waveguide path for introducing the microwave, being formed in an annular shape, a C-shape or a spiral shape, and the waveguide path having a portion formed with a slit facing the sealing member.

8. The plasma processing apparatus according to claim 7, wherein the waveguide is embedded with a dielectric.

9. A plasma processing apparatus characterized by comprising:

an antenna emitting a microwave, a container into which the microwave emitted from the antenna is to be introduced, a table being provided in the container for placing a work to be processed by plasma generated by the microwave introduced into the container, and an electrode being provided in the container, being connected to an electrical power source for application of a high frequency wave, facing the table, wherein the container has a sealing member provided at a location surrounding a perimeter of the electrode, the antenna is faced with the sealing member, and the plasma processing apparatus is adapted that the microwave emitted from the antenna is introduced into the container through the sealing member.

10. The plasma processing apparatus according to claim 9, wherein the electrode is made of a material of a silicon family.

11. The plasma processing apparatus according to claim 9, wherein the electrode is connected to a path for introducing a gas into the container, being formed with a hole for supplying the gas into the container.

12. The plasma processing apparatus according to claim 11, wherein the path is provided with a space for diffusing the introduced gas.

13. The plasma processing apparatus according to any of claim 9, further comprising a device for controlling of a temperature of the electrode.

14. The plasma processing apparatus according to any of claim 9, further comprising a power source for applying a high frequency wave to the table.

15. The plasma processing apparatus according to any of claims 9, wherein the antenna has a waveguide path for introducing the microwave, being formed in a annular shape, a C-shape or spiral shape, and the waveguide path having a portion formed with a slit, facing the sealing member.

16. The plasma processing apparatus according to claim 15, wherein the waveguide is embedded with a dielectric.

* * * * *

UNITED STATES PATENT AND TRADEMARK OFFICE
CERTIFICATE OF CORRECTION

| | | |
|---|---|---|
| PATENT NO. | : 6,358,361 B1 | Page 1 of 1 |
| APPLICATION NO. | : 09/486114 | |
| DATED | : March 19, 2002 | |
| INVENTOR(S) | : Naoki Matsumoto | |

It is certified that error appears in the above-identified patent and that said Letters Patent is hereby corrected as shown below:

TITLE PAGE, SHOULD READ
  (73) Assignee:   Tokyo Electron Limited
                         Tokyo (JP)

Signed and Sealed this

First Day of August, 2006

JON W. DUDAS
*Director of the United States Patent and Trademark Office*